(12) United States Patent
Chiu et al.

(10) Patent No.: US 8,908,858 B2
(45) Date of Patent: Dec. 9, 2014

(54) ROTATING MECHANISM AND ELECTRONIC DEVICE WITH SAME

(71) Applicant: Hon Hai Precision Industry Co., Ltd., New Taipei (TW)

(72) Inventors: Ming-Chien Chiu, New Taipei (TW); Chang-Ming Kuan, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 14/014,356

(22) Filed: Aug. 30, 2013

(65) Prior Publication Data

US 2014/0062279 A1 Mar. 6, 2014

(30) Foreign Application Priority Data

Aug. 31, 2012 (TW) .............................. 101131901 A

(51) Int. Cl.
*H04M 1/00* (2006.01)
*H04M 9/00* (2006.01)
*H05K 5/02* (2006.01)
*F16C 11/10* (2006.01)
*G06F 1/16* (2006.01)
*H04M 1/02* (2006.01)
*H04M 1/11* (2006.01)

(52) U.S. Cl.
CPC .............. *H05K 5/0217* (2013.01); *F16C 11/10* (2013.01); *G06F 1/1681* (2013.01); *H04M 1/02* (2013.01); *H04M 1/11* (2013.01)
USPC ..................................... 379/428.02; 379/455

(58) Field of Classification Search
CPC ......... H04M 1/02; H04M 1/11; G06F 1/1681; F16C 11/10; H05K 5/0217
USPC ....................... 379/428.01, 428.02, 419.455; 455/575.1; 361/679.02, 679.21, 361/679.26; 248/188.1, 188.6, 371, 351
See application file for complete search history.

(56) References Cited

U.S. PATENT DOCUMENTS

| | | | | |
|---|---|---|---|---|
| 5,644,469 | A | * | 7/1997 | Shioya et al. ............. 361/679.06 |
| 2007/0159783 | A1 | * | 7/2007 | Chen et al. .................... 361/683 |
| 2010/0160006 | A1 | * | 6/2010 | Wu ............................ 455/575.1 |

* cited by examiner

*Primary Examiner* — Tuan D Nguyen
(74) *Attorney, Agent, or Firm* — Novak Druce Connolly Bove + Quigg LLP

(57) ABSTRACT

An exemplary rotating mechanism for rotating a second body relative to a first body is provided. The first body includes a pair of sidewalls, and the second body includes a pair of connecting arms. A first connecting piece rotatably connects one of the connecting arms to one of the sidewalls, and a second connecting piece rotatably connects the other connecting arm to the other sidewall. A resilient element connects the second connecting piece to a sidewall to provide a restoring force to the second connecting piece along a direction perpendicular to the sidewall. An angle positioner is fixed on the other sidewall and is sleeved on the first connecting piece. The angle positioner defines a positioning gap to engage with a pair of lugs extending from the first connecting piece for positioning a relative rotation angle between the first body and the second body.

17 Claims, 10 Drawing Sheets

ROTATING MECHANISM AND ELECTRONIC DEVICE WITH SAME

BACKGROUND

1. Technical Field

The present disclosure relates to rotating mechanisms for rotatably connecting different bodies, and more particularly, to a rotating mechanism capable of adjusting a relative rotation angle between the different bodies.

2. Description of Related Art

An electronic device, such as a cellular phone or a notebook computer, can include two parts rotatably connected to each other. However, when the electronic device is used, time is required to adjust an angle between the two parts, which is inconvenient.

Therefore, it is desirable to provide a means which can overcome the above-mentioned problems.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Embodiments of the present disclosure will now be described in detail below, with reference to the accompanying drawings.

Figure 1:
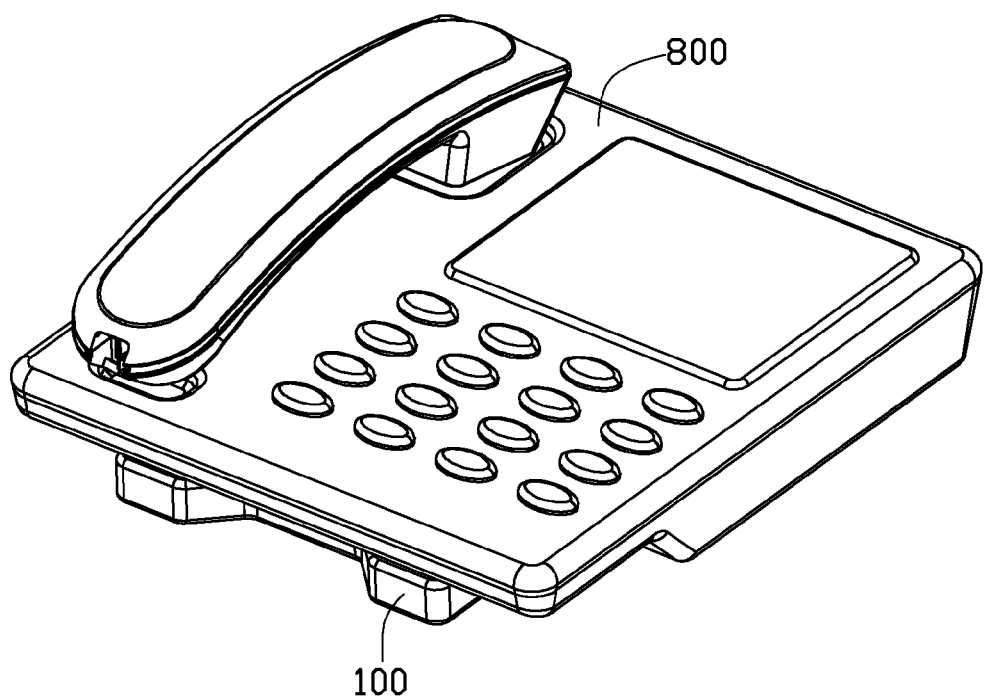
FIG. 1 is an isometric view of an electronic device according to an exemplary embodiment.
Figure 2:
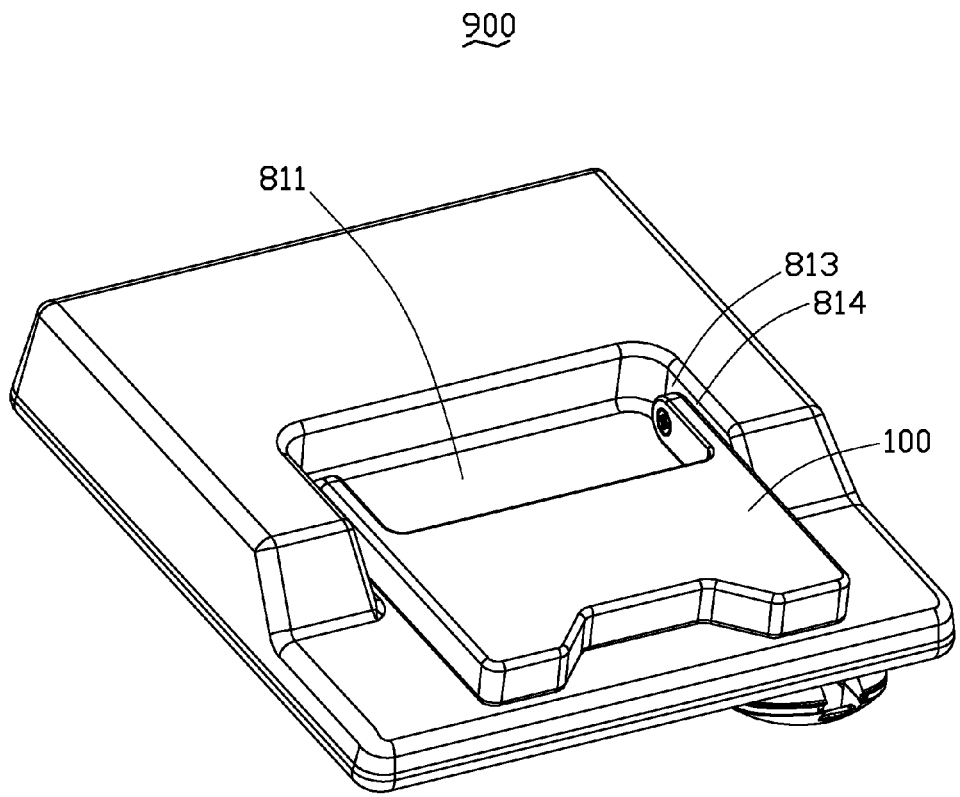
FIG. 2 is an isometric view of the electronic device of FIG. 1, viewed from another angle.
Figure 3:
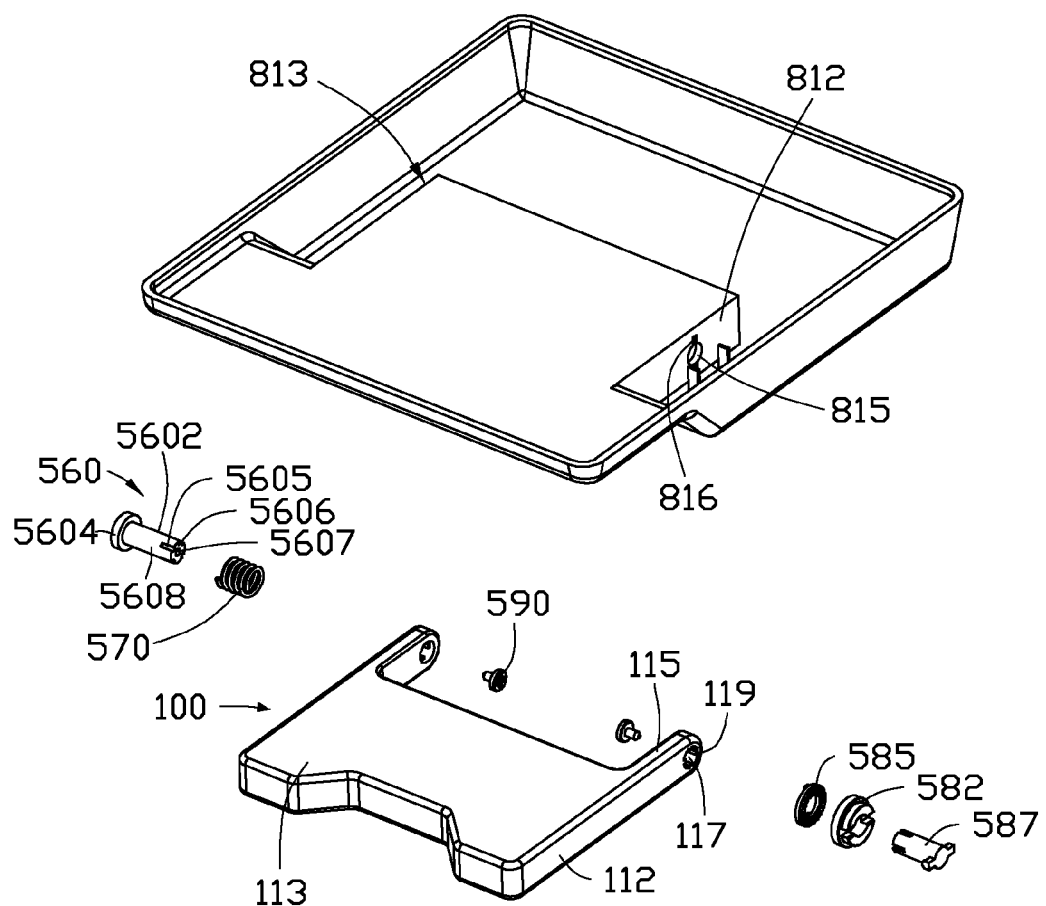
FIG. 3 is an exploded, isometric, schematic view of the electronic device of FIG. 1, showing that the electronic device includes an angle positioner and a second connecting piece.

FIGS. 1-3 illustrate an electronic device 900 in accordance with an exemplary embodiment. The electronic device 900 includes a first body 800, a second body 100, and a rotating mechanism 500 rotatably connecting the first body 800 to the second body 100. In this embodiment, the electronic device 900 is a telephone. The first body 800 is a base with a receiver. The second body 100 is a support rotatably connected to a bottom of the base for supporting the base at a predetermined angle.

Further referring to FIG. 3, the first body 800 includes a pair of sidewalls 813. The second body 100 is rotatably connected to the sidewalls 813. The first body 800 defines a receiving space 811 between the pair of sidewalls 813 for accommodating the second body 100. Each of the sidewalls 813 includes an outer surface 814 and an inner surface 812. Each sidewall 813 defines a first connecting through hole 815 passing through the outer surface 814 and the inner surface 812. One of the sidewalls 813 defines a pair of positioning grooves 816 in the inner surface 812. The positioning grooves 816 are symmetrical about a center of the first connecting through hole 815.

The second body 100 includes a supporting part 113, and a pair of connecting arms 115 extending from the supporting part 113. The supporting part 113 is substantially a rectangular block and includes a pair of parallel peripheries 112. The connecting arms 115 correspondingly extend from ends of the pair of parallel peripheries 112 at a same side of the supporting part 113. The connecting arms 115 extend continuously from the peripheries 112 along a direction perpendicular to a longitudinal direction of the supporting part 113. Each of the connecting arms 115 defines a second connecting through hole 117 extending along the longitudinal direction of the supporting part 113. Each of the connecting arms 115 also forms a number of positioning ribs 119 on an inner sidewall of the second connecting through hole 117. The positioning ribs 119 are evenly spaced apart and extend along a length of the second connecting through hole 117.

Figure 4:
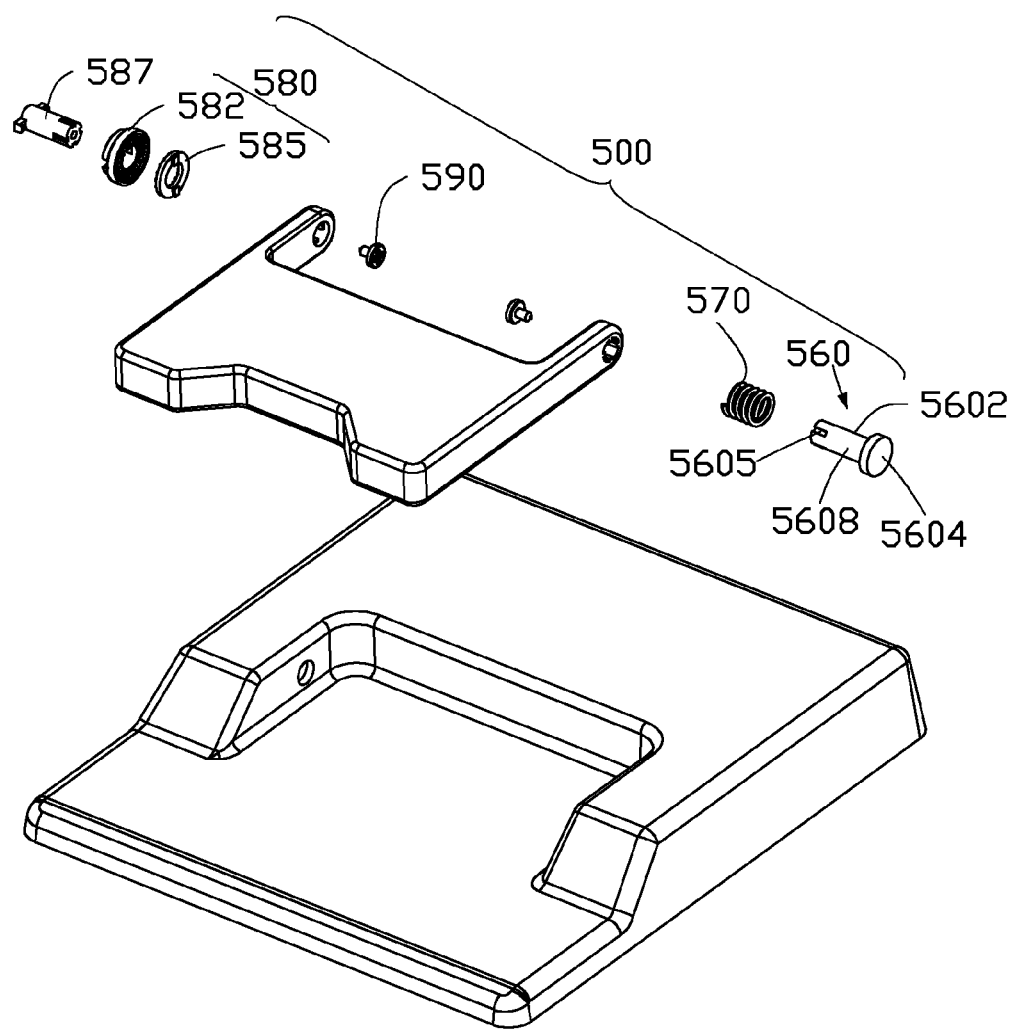
FIG. 4 is similar to FIG. 3, but viewed from another angle.

Referring to FIGS. 3 and 4, the rotating mechanism 500 includes an angle positioner 580, a first connecting piece 587, a second connecting piece 560, a pair of screws 590, and a resilient element 570. The angle positioner 580 includes a fixing piece 585 and a rotating piece 582.

The first connecting piece 587 includes a first connecting pole 5870 and a pair of lugs 5875. The first connecting pole 5870 includes a first connecting end surface 5873, a positioning end surface 5871 substantially parallel to the first connecting end surface 5873, and a first side surface 5876 connecting the first connecting end surface 5873 to the positioning end surface 5871. The first connecting piece 587 defines a number of first sliding grooves 5872 in the first side surface 5876 corresponding to the positioning ribs 119, and a first connecting hole 5874 in the first connecting end surface 5873. The first sliding grooves 5872 extend along a longitudinal direction of the first connecting pole 5870 from the first connecting end surface 5873 and are evenly spaced apart. The lugs 5875 extend from the first side surface 5876 and are coplanar with the positioning end surface 5871. The lugs 5875 extend radially outward from the first connecting pole 5870 and are symmetrical about a center of the positioning end surface 5871. A diameter of the first connecting pole 5870 is substantially equal to a diameter of the second connecting through hole 117.

The second connecting piece 560 includes a second connecting pole 5602, and a flange 5604 at one end of the second connecting pole 5602. The second connecting pole 5602 includes a second connecting end surface 5606 opposite to the flange 5604, and a second side surface 5608 connecting the second end surface with the flange 5604. The second connecting piece 560 defines a number of second sliding grooves 5605 in the second side surface 5608 corresponding to the positioning ribs 119, and a second connecting hole 5607 in the second connecting end surface 5606. The second sliding grooves 5605 extend along a longitudinal direction of the second connecting pole 5602 from the second connecting end surface 5606, and are evenly space apart.

The resilient element 570 is set between the second connecting piece 560 and one of the connecting arms 115 to provide a restoring force to the second connecting piece 560. In this embodiment, the resilient element 570 is a spring.

Figure 5:
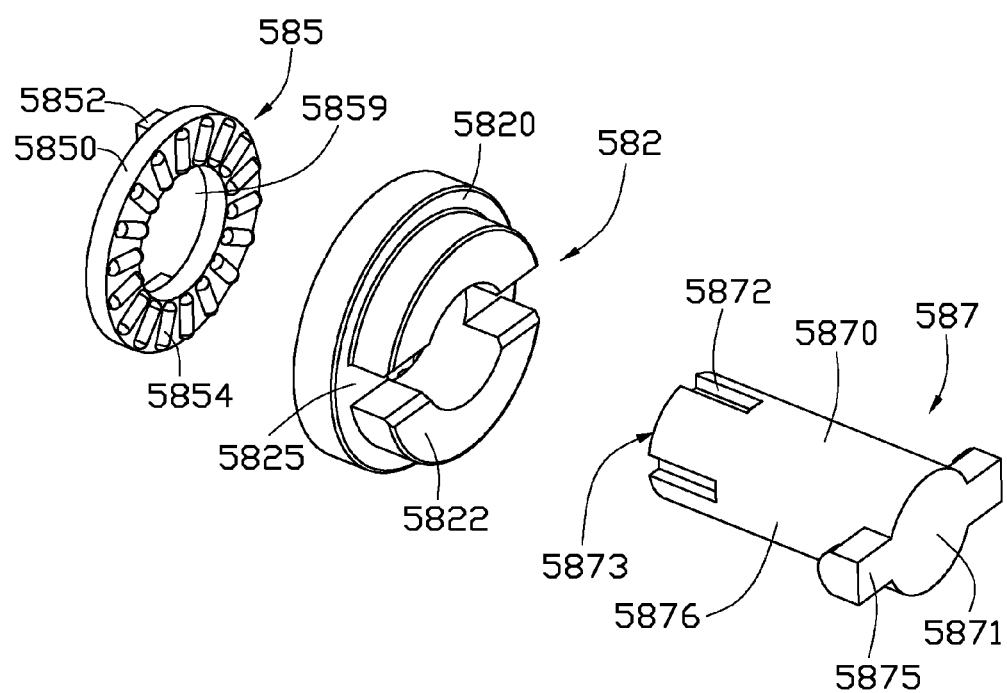
FIG. 5 is an enlarged, isometric, schematic view of the angle positioner and the second connecting piece of FIG. 3
Figure 6:
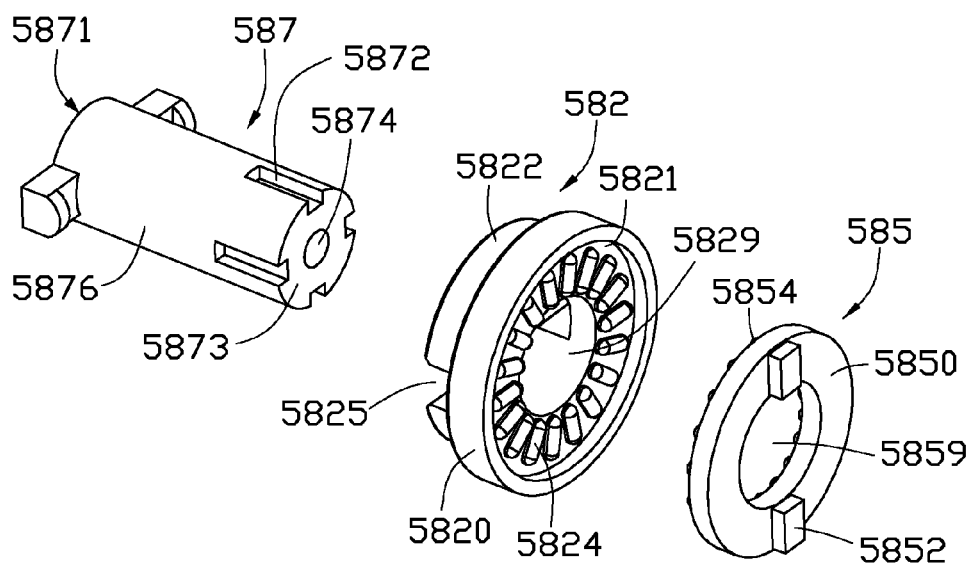
FIG. 6 is similar to FIG. 5, but viewed from another angle.

Referring to FIGS. 5 and 6, the fixing piece 585 includes a substrate 5850, a pair of positioning projections 5852, and a number of first angled teeth 5854. The substrate 5850 is a substantially circular ring-shaped plate, and defines a first assembly through hole 5859 at a center thereof. The positioning projections 5852 are formed on one of two parallel flat surfaces of the substrate 5850. The positioning projections 5852 are arranged opposite to each other about the first assembly through hole 5859. The first angled teeth 5854 are radially formed on the other one of two parallel flat surfaces of the substrate 5850. The first angled teeth 5854 surround the first assembly through hole 5859 and are evenly spaced apart. Each of the first angled teeth 5854 is substantially a semi-cylindrical projection and extends along the radial direction of the substrate 5850.

The rotating piece 582 includes a main body 5820, a pair of angle positioning projections 5822, and a number of second angled teeth 5824. The main body 5820 is a substantially circular ring-shaped plate, and defines a second assembly through hole 5829 at a center thereof. The main body 5820 defines a receiving groove 5821 in one of two parallel flat surfaces of the main body 5820. The angle positioning projections 5822 extend from the other one of the two parallel flat surfaces of the main body 5820. Each of the angle positioning projections 5822 is a substantially semi-circular block surrounding the second assembly through hole 5829. The angle positioning projections 5822 are symmetrical about a center of the second assembly through hole 5829 and cooperatively define a positioning gap 5825 therebetween. The positioning gap 5825 extends along a radial direction of the main body 5820. The second angled teeth 5824 are radially formed on a bottom surface of the receiving groove 5821. The second angled teeth 5824 surround the second assembly through hole 5829 and are evenly spaced apart. Each of the second angled teeth 5824 is substantially a semi-cylindrical projection and extends along the radial direction of the substrate 5850. An inner diameter of the receiving groove 5821 is substantially equal to an external diameter of the substrate 5850. Thus, the fixing piece 585 is received in the receiving groove 5821, such that the second angled teeth 5824 face the first angled teeth 5854. The first assembly through hole 5859 is aligned with the second assembly through hole 5829 to form an assembly through hole 5802 of the angle positioner 580. The second angled teeth 5824 mesh with the first angled teeth 5854 to form a rotation angle between the fixing piece 585 and the rotating piece 582. To drive the rotating piece 582 to rotate along a circumferential direction of the rotating piece 582, the second angled teeth 5824 are slid over the first angled teeth 5854 one at a time. Therefore, the rotation angle between the fixing piece 585 and the rotating piece 582 is regulated.

Figure 7:
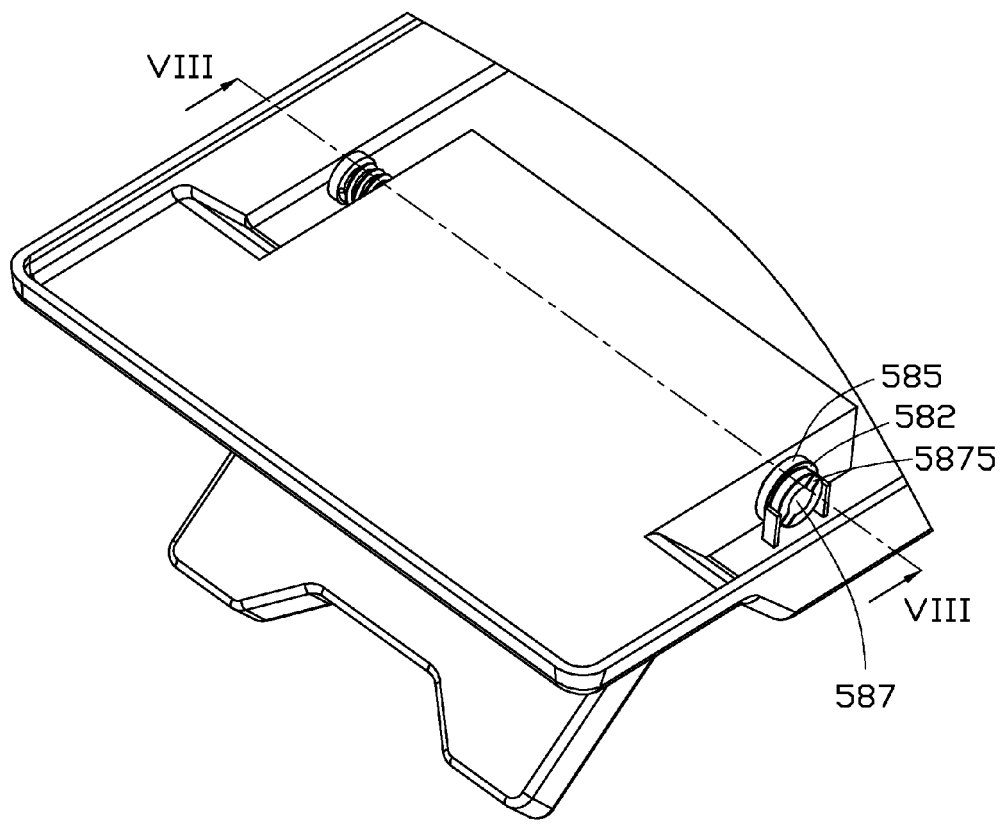
FIG. 7 is a partial assembled, isometric, schematic view of the electronic device of FIG. 1, showing that the first connecting piece is positioned by the angle positioner.
Figure 8:
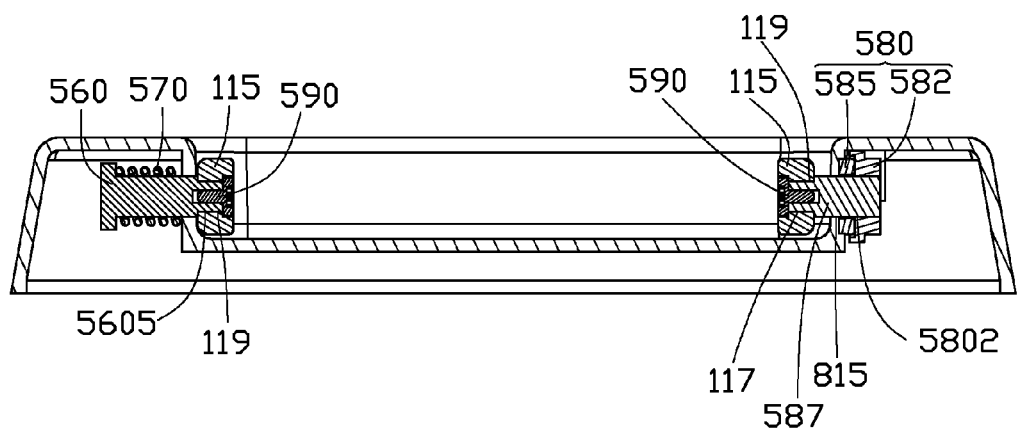
FIG. 8 is a cross-sectional view taken along line VIII-VIII of FIG. 7.

Referring to FIGS. 7 and 8, in assembly, the rotating piece 582 is assembled to the fixing piece 585 to make the angle positioner 580. The positioning projections 5852 correspondingly insert into the positioning grooves 816 to fix the angle positioner 580 on the inner surface 812 of the sidewall 813. The assembly through hole 5802, the first connecting through holes 815, and the second connecting through holes 117 are aligned with each other. The first connecting pole 5870 passes through the assembly through hole 5802, the first connecting through hole 815, and a second connecting through hole 117, such that the first connecting end surface 5873 extends out of the outer surface 814. The first sliding grooves 5872 of the first connecting pole 5870 correspondingly receive the positioning ribs 119 of the connecting arm 115. One of the screws 590 is screwed into the first connecting hole 5874 to rotatably connect one of the connecting arms 115 with the first connecting piece 587. The lugs 5875 are received in the positioning gap 5825 of the angle positioner 580. The second connecting pole 5602 passes through the resilient element 570, the other first connecting through hole 815, and the other second connecting through hole 117, such that the second connecting end surface 5606 extends out of the outer surface 814. The second sliding grooves 5605 are correspondingly received by the positioning ribs 119 formed on the other connecting arm 115. The other screw 590 is screwed into the second connecting hole 5607 to rotatably connect the other connecting arm 115 with the second connecting piece 560. Thus, the second body 100 is rotatably connected to the first body 800 via the first connecting piece 587 and the second connecting piece 560. The resilient element 570 connects the second connecting piece 560 to the inner surface 812 of the sidewall 813. One end of the spring resists again the flange 5604 of the second connecting pole 5602. The other end of the spring resists again the inner surface 812 of the sidewall 813.

Figure 9:
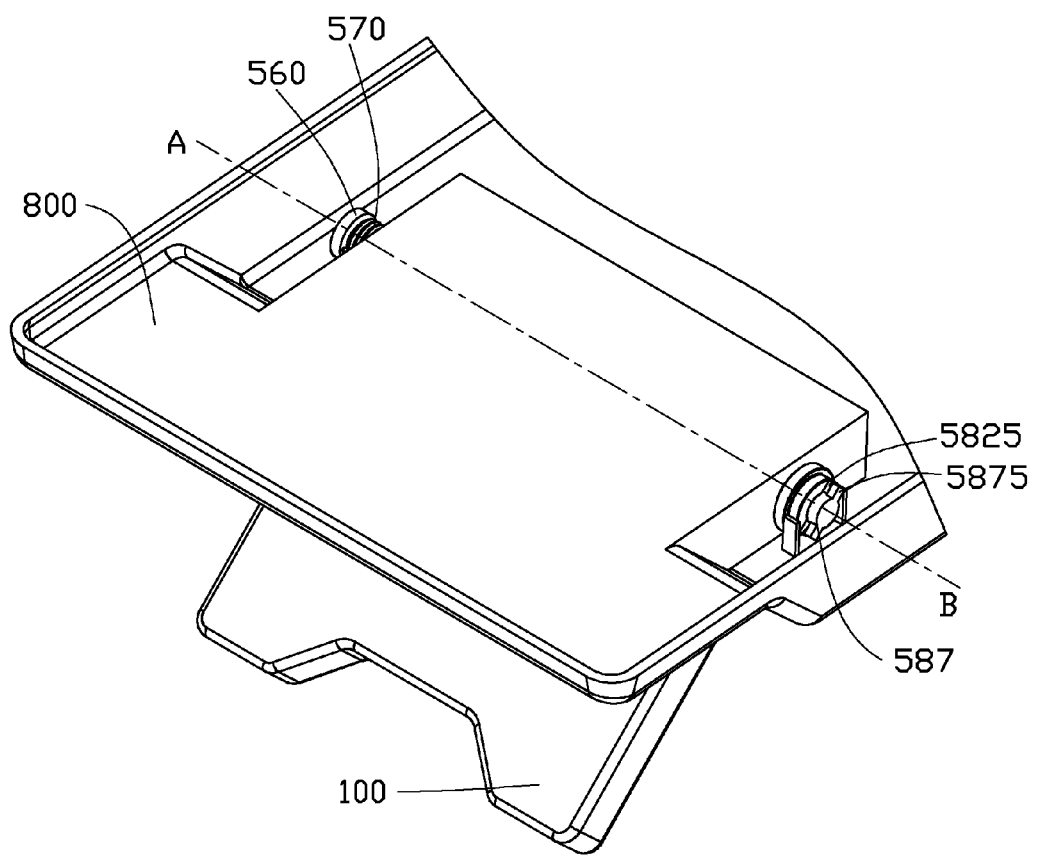
FIG. 9 is similar to FIG. 7, showing the first connecting piece pulled out of the angle positioner.
Figure 10:
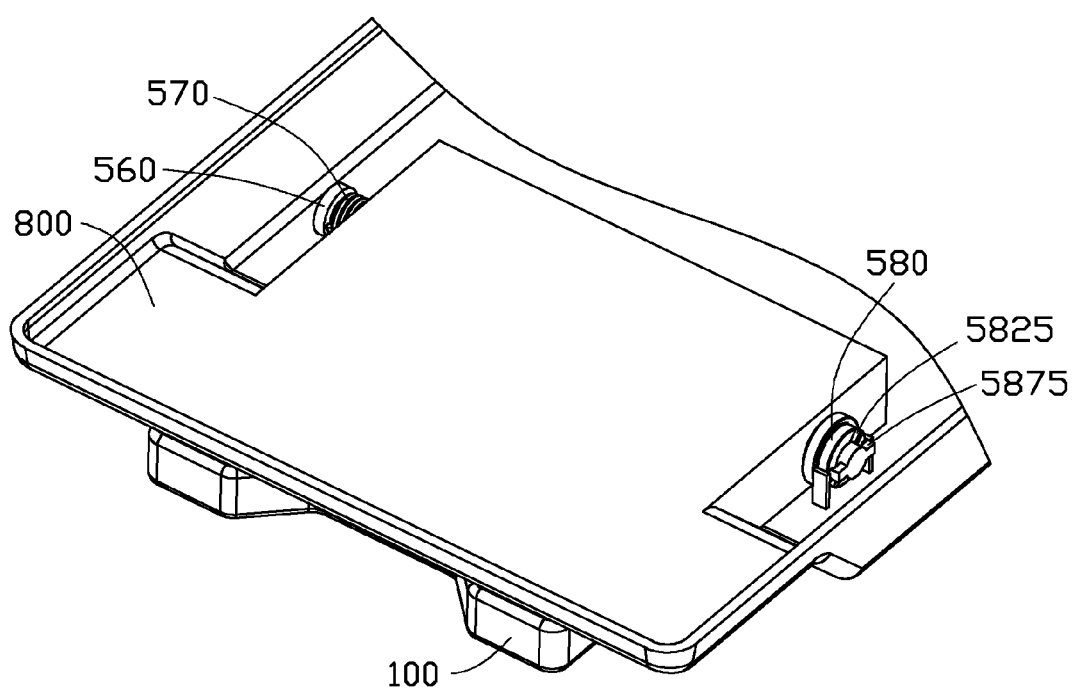
FIG. 10 is similar to FIG. 9, but shows the first connecting piece rotated back to an original position.

Referring to FIGS. 9 and 10, in use, to adjust a rotation angle between the first body 800 and the second body 100, the second body 100 is rotated around a rotation axis AB between the first connecting piece 587 and the second connecting piece 560. The first connecting piece 587 and the second connecting piece 560 are rotated with the second body 100 by the positioning ribs 119 engaging with the first sliding grooves 5872 and the second sliding grooves 5605. The lugs 5875 are still received in the positioning gap 5825, so the rotating piece 582 is driven to rotate by the lugs 5875. The fixing piece 585 is fixed on the inner surface 812. Because the positioning gap 5825 extends along the radial direction of the rotating piece 582, an extending direction of the positioning gap 5825 is changed when the rotating piece 582 rotates relative to the fixing piece 585. When the second body 100 is adjusted to an appropriate rotation angle relative to the first body 800, the first angled teeth 5854 and the second angled teeth 5824 hold the second body 100 at the rotation angle relative to the first body 800.

To rotate the second body 100 back to an original position while keeping the positioning gap 5825 in the same position, the second connecting piece 560 is pushed to compress the resilient element 570. This makes the second connecting piece 560 slide along the positioning ribs 119, and the lugs 5875 are pushed out of the positioning gap 5825. Thus, the lugs 5875 are not restricted in the positioning gap 5825. Then, the second body 100 is rotated back to the original position. The lugs 5875 rotate on the angle positioning projections 5822 without changing the extending direction of the positioning gap 5825. Thus, the appropriate relative rotation angle between the first body 800 and the second body 100 is maintained by the positioning gap 5825. Therefore, the next time the second body 100 is rotated, the second body 100 is rotated to the same rotation angle where is maintained via the positioning gap by rotating the lugs 5875 until the lugs 5875 are pulled into the gap 5825 by a restoring force of the resilient element 570, and time is saved adjusting the rotation angle.

While various exemplary and preferred embodiments have been described, it is to be understood that the disclosure is not limited thereto. To the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. A rotating mechanism for rotatably connecting a first body with a second body, the first body comprising a pair of sidewalls, the second body comprising a pair of connecting arms, the rotating mechanism comprising:

a first connecting piece rotatably connecting one of the connecting arms to one of the sidewalls;

a second connecting piece rotatably connecting the other one of the connecting arms to the other one of the sidewalls;

a resilient element connecting the second connecting piece with the sidewall and providing a restoring force to the second connecting piece along a direction perpendicular to the sidewall; and an angle positioner fixed on one of the sidewall and sleeved on the first connecting piece;

wherein the angle positioner comprises a pair of angle positioning projections and defines a positioning gap between the angle positioning projection, the angle positioning projections are rotated about the first connecting piece to adjust an extending direction of positioning gap, the first connecting piece comprises a pair of lugs formed at an end of the first connecting piece, and the lugs are pulled into the angle positioning gap by the restoring force when the first connecting piece are rotated to a position where the lugs are aligned with the angle positioning gap.

2. The rotating mechanism of claim 1, wherein the angle positioner comprises a fixing piece and a rotating piece, the fixing piece is fixed on an inner surface of the sidewall, the rotating piece rotatably meshes with the fixing piece, and the angle positioning projections are formed on the rotating piece.

3. The rotating mechanism of claim 2, wherein the fixing piece comprises a substrate, a pair of positioning projections formed on one of two parallel surface of the substrate, and a plurality of first angled teeth formed on the other one of two parallel surfaces of the substrate, the substrate defines a first assembly through hole at a center thereof, the positioning projections are correspondingly inserted into a pair of positioning grooves to fix the fixing piece to the sidewall, the first angled teeth radially surround the first assembly through hole and are evenly spaced apart.

4. The rotating mechanism of claim 3, wherein the rotating piece comprises a main body and a plurality of second angled teeth, the main body defines a second assembly through hole at a center thereof and a receiving groove in one of two parallel surfaces of the main body, the second angled teeth are radially formed on a bottom surface of the receiving groove, surround the second assembly through hole, and are evenly spaced apart, the fixing piece is received in the receiving groove by the second angled teeth meshing with the first angled teeth and the first assembly through hole aligning with the second assembly through hole to incorporate the fixing piece and the rotating piece into the angle positioner.

5. The rotating mechanism of claim 4, wherein both of the first angled teeth and the second angled teeth are a plurality of semi-cylindrical projections extending along the radial direction of the angle positioner.

6. The rotating mechanism of claim 4, wherein the angle positioning projections extend from the other one of the two parallel surfaces of the main body and are symmetrical about a center of the second assembly through hole, and the positioning gap is extended along a radial direction of the main body.

7. The rotating mechanism of claim 4, wherein the first connecting piece further comprises a first connecting pole, the angle positioner are sleeved on the first connecting pole by passing through the first assembly hole and the second assembly hole, the lugs extend along a radial direction of the first connecting pole and are symmetrical about a central symmetrical axis of the first connecting pole, and the other end of the first connecting pole opposite to the lugs is fastened to the connecting arm.

8. The rotating mechanism of claim 1, wherein the second connecting piece comprises a second connecting pole and a flange at one end of the second connecting pole, and an end of the second connecting pole opposite to the flange is fastened to the connecting arm.

9. An electronic device comprising:
a first body comprising a pair of sidewalls;
a second body received between the sidewalls and comprising a pair of connecting arms;
a rotating mechanism comprising:
a first connecting piece rotatably connecting one of the connecting arm to one of the sidewalls;
a second connecting piece rotatably connecting the other one of the connecting arms to the other one of the sidewalls;
a resilient element connecting the second connecting piece with the sidewall and providing a restoring force to the second connecting piece along a direction perpendicular to the sidewall; and
an angle positioner fixed on one of the sidewall and sleeved on the first connecting piece;
wherein the angle positioner comprises a pair of angle positioning projections and defines a positioning gap between the angle positioning projection, the angle positioning projections are rotated about the first connecting piece to adjust an extending direction of positioning gap, the first connecting piece comprises a pair of lugs formed at an end of the first connecting piece, and the lugs are pulled into the angle positioning gap by the restoring force when the first connecting piece are rotated to a position where the lugs are aligned with the angle positioning gap.

10. The electronic device of claim 9, wherein the angle positioner comprises a fixing piece and a rotating piece, the fixing piece is fixed on an inner surface of the sidewall, the rotating piece rotatably meshes with the fixing piece, and the angle positioning projections are formed on the rotating piece.

11. The electronic device of claim 10, wherein the fixing piece comprises a substrate, a pair of positioning projections formed on one of two parallel surface of the substrate, and a plurality of first angled teeth formed on the other one of two parallel surfaces of the substrate, the substrate defines a first assembly through hole at a center thereof, the positioning projections are correspondingly inserted into a pair of positioning grooves to fix the fixing piece to the sidewall, the first angled teeth radially surround the first assembly through hole and are evenly spaced apart.

12. The electronic device of claim 11, wherein the rotating piece comprises a main body and a plurality of second angled teeth, the main body defines a second assembly through hole at a center thereof and a receiving groove in one of two parallel surfaces of the main body, the second angled teeth are radially formed on a bottom surface of the receiving groove, surround the second assembly through hole, and are evenly spaced apart, and the fixing piece is received in the receiving groove by the second angled teeth meshing with the first angled teeth and the first assembly through hole aligning with the second assembly through hole to incorporate the fixing piece and the rotating piece into the angle positioner.

13. The electronic device of claim 12, wherein both of the first angled teeth and the second angled teeth are a plurality of semi-cylindrical projections extending along the radial direction of the angle positioner.

14. The electronic device of claim 12, wherein the angle positioning projections extend from the other one of the two parallel surfaces of the main body and are symmetrical about a center of the second assembly through hole, and the positioning gap is extended along a radial direction of the main body.

15. The electronic device of claim 12, wherein the second body further comprises a supporting part, the pair of connecting arms correspondingly extend from two parallel peripheries of the supporting part, each of the connecting arms defines a connecting through hole extending along the longitudinal direction of the supporting part and forms a plurality of positioning ribs on an inner sidewall of the connecting through hole, and the positioning ribs are evenly spaced apart and extend along a length of the connecting through hole.

16. The electronic device of claim 15, wherein the first connecting piece further comprises a first connecting pole and defines a plurality of first sliding groove corresponding to the positioning ribs at an end of first connecting pole opposite to the lugs, the angle positioner are sleeved on the first connecting pole by passing through the first assembly hole and the second assembly hole, the lugs extend along a radial direction of the first connecting pole and are symmetrical about a central symmetrical axis of the first connecting pole, and the first sliding grooves correspondingly receive the positioning ribs when the first connecting pole inserts into the connecting through hole.

17. The electronic device of claim 15, wherein the second connecting piece comprises a second connecting pole and a flange at one end of the second connecting pole, the second connecting piece defines a plurality of second sliding grooves at an end of the second connecting pole opposite to the flange, and the second sliding grooves correspondingly engage with the positioning ribs when the second connecting pole inserts into the connecting through hole.

\* \* \* \* \*